United States Patent
Mo et al.

(10) Patent No.: US 11,227,938 B2
(45) Date of Patent: Jan. 18, 2022

(54) THIN FILM TRANSISTOR STRUCTURE, MANUFACTURING METHOD THEREOF, AND DISPLAY DEVICE

(71) Applicant: HKC Corporation Limited, Guangdong (CN)

(72) Inventors: Qionghua Mo, Shenzhen (CN); En-Tsung Cho, Shenzhen (CN)

(73) Assignee: HKC Corporation Limited, Guangdong (CN)

( * ) Notice: Subject to any disclaimer, the term of this patent is extended or adjusted under 35 U.S.C. 154(b) by 0 days.

(21) Appl. No.: 17/043,497

(22) PCT Filed: Dec. 11, 2018

(86) PCT No.: PCT/CN2018/120171
§ 371 (c)(1),
(2) Date: Oct. 1, 2020

(87) PCT Pub. No.: WO2020/113613
PCT Pub. Date: Jun. 11, 2020

(65) Prior Publication Data
US 2021/0057549 A1     Feb. 25, 2021

(30) Foreign Application Priority Data
Dec. 3, 2018   (CN) .......................... 201811466314.5

(51) Int. Cl.
*H01L 29/66*     (2006.01)
*H01L 21/02*     (2006.01)
(Continued)

(52) U.S. Cl.
CPC .. *H01L 29/66765* (2013.01); *H01L 21/02532* (2013.01); *H01L 21/02592* (2013.01);
(Continued)

(58) Field of Classification Search
CPC ......... H01L 29/66765; H01L 21/02532; H01L 21/02592; H01L 21/28079; H01L 21/3065;
(Continued)

(56) References Cited

U.S. PATENT DOCUMENTS 9,343,580 B2    5/2016 Matsukizono
2002/0096681 A1  7/2002 Yamazaki et al.
(Continued)

FOREIGN PATENT DOCUMENTS

CN    101552242 A    10/2009
CN    102184967 A    9/2011
(Continued)

OTHER PUBLICATIONS

International Search Report for Application No. PCT/CN2018/120171 dated Aug. 27, 2019, 2 pages.
(Continued)

*Primary Examiner* — Mohammed R Alam
(74) *Attorney, Agent, or Firm* — Seyfarth Shaw LLP

(57) ABSTRACT

Provided are a thin film transistor structure, a manufacturing method thereof, and a display device. The method comprises: providing a substrate (10), and sequentially forming a gate (20), a gate insulating layer (30), an active layer (40), a doped layer (50), a source (610), a drain (620) and a channel region (70) on the substrate (10); placing the channel region (70) in a preset gas atmosphere for heating treatment; wherein, the channel region (70) is placed in a nitrogen atmosphere to heat for a first preset time, in a mixed atmosphere of nitrogen and ammonia to heat for a second preset time, in an ammonia atmosphere to heat for a third preset time; or first heating the channel region (70) for a fourth preset time, finally placing in the ammonia atmosphere to heat for a fifth preset time.

7 Claims, 4 Drawing Sheets

(51) Int. Cl.
    *H01L 21/28*          (2006.01)
    *H01L 21/3065*       (2006.01)
    *H01L 21/3213*       (2006.01)
    *H01L 27/12*          (2006.01)
    *H01L 29/423*         (2006.01)
    *H01L 29/49*          (2006.01)
    *H01L 29/786*         (2006.01)

(52) U.S. Cl.
    CPC .... *H01L 21/28079* (2013.01); *H01L 21/3065* (2013.01); *H01L 21/32133* (2013.01); *H01L 27/127* (2013.01); *H01L 27/1222* (2013.01); *H01L 29/42384* (2013.01); *H01L 29/4908* (2013.01); *H01L 29/78669* (2013.01); *H01L 2029/42388* (2013.01)

(58) Field of Classification Search
    CPC ........... H01L 21/32133; H01L 27/1222; H01L 27/127; H01L 29/42384; H01L 29/4908; H01L 29/78669; H01L 2029/42388; H01L 21/02488; H01L 21/02422; H01L 21/0262; H01L 21/02576; H01L 29/0688; H01L 29/66742; H01L 29/786
    See application file for complete search history.

(56) References Cited

U.S. PATENT DOCUMENTS

| | | | |
|---|---|---|---|
| 2009/0127557 A1* | 5/2009 | Lin | H01L 27/127 257/59 |
| 2009/0140254 A1 | 6/2009 | Ahn et al. | |
| 2009/0166630 A1 | 7/2009 | Cho et al. | |
| 2011/0220897 A1* | 9/2011 | Shin | H01L 29/4908 257/59 |
| 2012/0043548 A1 | 2/2012 | Arai et al. | |
| 2012/0139043 A1 | 6/2012 | Wu et al. | |
| 2013/0105802 A1* | 5/2013 | Harumoto | H01L 29/04 257/59 |
| 2017/0236947 A1* | 8/2017 | Zhang | H01L 29/66742 257/72 |
| 2019/0074381 A1* | 3/2019 | Park | H01L 29/0665 |

FOREIGN PATENT DOCUMENTS

| | | |
|---|---|---|
| CN | 102598281 A | 7/2012 |
| CN | 102629588 A | 8/2012 |
| CN | 102768989 A | 11/2012 |
| CN | 103762178 A | 4/2014 |
| CN | 103779362 A | 5/2014 |
| CN | 103988288 A | 8/2014 |
| CN | 104766859 A | 7/2015 |
| CN | 104966720 A | 10/2015 |
| CN | 105161503 A | 12/2015 |
| CN | 107591411 A | 1/2018 |
| CN | 108335969 A | 7/2018 |

OTHER PUBLICATIONS

Chinese Office Action for Application No. 201811466315.X dated Apr. 27, 2020, 10 pages.
Chinese Office Action for Application No. 201811466312.6 dated May 14, 2020, 10 pages.
Chinese Office Action for Application No. 201811466314.5 dated Nov. 28, 2020, 7 pages.

* cited by examiner

THIN FILM TRANSISTOR STRUCTURE, MANUFACTURING METHOD THEREOF, AND DISPLAY DEVICE This application is a U.S. National Stage application of, and claims priority to, PCT/CN2018/120171, filed Dec. 11, 2018, which further claims priority to Chinese Patent Application No. 2018114663145, filed Dec. 3, 2018, the entire contents of which are incorporated herein in their entirety.

CROSS REFERENCE TO RELATED APPLICATIONS

The present disclosure claims the benefit of Chinese Patent Application No. 201811466314.5, filed on Dec. 3, 2018, entitled "THIN FILM TRANSISTOR STRUCTURE, MANUFACTURING METHOD THEREOF, AND DISPLAY DEVICE", the entire content of which is incorporated herein in its entirety.

TECHNICAL FIELD

The present disclosure relates to the field of display technologies, and more particularly relates to a thin film transistor structure, a manufacturing method thereof, and a display apparatus.

BACKGROUND

The description herein provides only background information related to the present disclosure, but does not necessarily constitute the existing technology.

The GOA (Gate Driven on Array) technology can implement a function of scanning and driving row by row of a display panel. A gate drive circuit is integrated on an array substrate of the display panel by using the GOA technology, to omit a gate drive integrated circuit, to reduce product costs from aspects of material costs and a manufacturing process.

Compared with integrated circuit drive, using the GOA drive technology has certain quality and reliability risks mainly because of a threshold voltage offset caused by offset characteristics of doping an amorphous silicon semiconductor in a switch element for controlling to scan switches row by row, for example, a thin film transistor (TFT). How to reduce the threshold voltage offset in a TFT device to improve a display effect of a display is a problem that needs to be urgently resolved by a person skilled in the art.

SUMMARY

According to various embodiments of the present disclosure, a method of manufacturing a thin film transistor structure which can reduce a threshold voltage offset in a TFT device is provided.

In addition, a thin film transistor structure and a display apparatus are further provided.

A method of manufacturing a thin film transistor structure includes:

providing a substrate, depositing a first metal layer on the substrate, and performing patterning processing on the first metal layer to form a gate;

depositing a gate insulation layer on the substrate, the gate insulation layer covering the gate;

sequentially depositing an active layer and a doped layer on the gate insulation layer;

performing photoetching processing on the active layer and the doped layer;

depositing a second metal layer on the doped layer, performing photoetching and wet etching processing on the second metal layer to obtain a first groove located in a middle portion of the second metal layer and penetrating through the second metal layer, the second metal layer being separated by the first groove into a source and a drain;

performing dry etching processing on the active layer and the doped layer by using the source and the drain as an etching barrier layer, to obtain a second groove corresponding to the first groove, the second groove penetrates through the doped layer and partially penetrates to the active layer, the first groove and the second groove form a channel region; and placing the channel region in a preset gas atmosphere for heating processing, the channel region is first heated for a first preset time, then placed in an atmosphere of nitrogen to heat for a second preset time, and at last placed in an atmosphere of ammonia to heat for a third preset time; or the channel region is first heated for a fourth preset time and at last placed in an atmosphere of ammonia to heat for a fifth preset time.

In one of the embodiments, when depositing the doped layer, deposition is performed in a manner of increasing a total volume of a deposition gas, a reference range of the total volume is 41200 sccm to 43200 sccm, and when the total volume increases by 100%, a gas flow ratio of $PH_3$ to $SiH_4$ in the deposition gas ranges from 1.8 to 4.5.

In one of the embodiments, when the total volume increases by 150%, the gas flow ratio of $PH_3$ to $SiH_4$ in the deposition gas ranges from 2 to 6.

In one of the embodiments, the first preset time ranges from 0 s to 50 s, the second preset time ranges from 0 s to 20 s, the third preset time ranges from 0 s to 20 s, the fourth preset time ranges from 0 s to 50 s, and the fifth preset time ranges from 0 s to 20 s.

In one of the embodiments, the first preset time is 25 s, the second preset time is 15 s, the third preset time is 7 s, the fourth preset time is 25 s, and the fifth preset time is 10 s.

In one of the embodiments, the depositing the gate insulation layer is divided into a first rate deposition, a second rate deposition, and a third rate deposition, and values of the first rate, the second rate, and the third rate sequentially decrease.

In one of the embodiments, a thickness of the gate insulation layer formed by the first rate deposition ranges from 500 Å to 1000 Å, a thickness of the gate insulation layer formed by the second rate deposition is 1000 Å, and a thickness of the gate insulation layer formed by the third rate deposition is 2000 Å.

In one of the embodiments, a deposition process of the first metal layer includes one of radio frequency magnetron sputtering, thermal evaporation, vacuum electron beam evaporation, and a plasma enhanced chemical vapor deposition process.

A thin film transistor structure, manufactured by using the method of manufacturing the thin film transistor structure, the method includes:

providing a substrate, depositing a first metal layer on the substrate, and performing patterning processing on the first metal layer to form a gate;

depositing a gate insulation layer on the substrate, the gate insulation layer covering the gate;

sequentially depositing an active layer and a doped layer on the gate insulation layer;

performing photoetching processing on the active layer and the doped layer;

depositing a second metal layer on the doped layer, performing photoetching and wet etching processing on the second metal layer to obtain a first groove located in a middle portion of the second metal layer and penetrating through the second metal layer, the second metal layer being separated by the first groove into a source and a drain;

performing dry etching processing on the active layer and the doped layer by using the source and the drain as an etching barrier layer, to obtain a second groove corresponding to the first groove, the second groove penetrates through the doped layer and partially penetrates to the active layer, the first groove and the second groove form a channel region; and placing the channel region in a preset gas atmosphere for heating processing, the channel region is first heated for a first preset time, then placed in an atmosphere of nitrogen to heat for a second preset time, and at last placed in an atmosphere of ammonia to heat for a third preset time; or the channel region is first heated for a fourth preset time and at last placed in an atmosphere of ammonia to heat for a fifth preset time;

the thin film transistor structure includes:

a substrate;

a gate, formed on the substrate;

a gate insulation layer, formed on the substrate, the gate insulation layer covers the gate;

an active layer, formed on the gate insulation layer;

a doped layer, formed on the active layer; and a source and a drain, formed on the doped layer, a channel region is located in a middle portion of the doped layer, the channel region penetrates through the doped layer and partially penetrates to the active layer, the source and the drain are located on both sides of the channel region.

In one of the embodiments, a thickness range of the gate is 3000 Å to 5000 A.

In one of the embodiments, the gate includes at least one of molybdenum, titanium, aluminum, and copper.

In one of the embodiments, a thickness range of the active layer is 550 Å to 700 Å.

In one of the embodiments, the active layer includes amorphous silicon.

In one of the embodiments, a thickness range of the source is 3500 Å to 5000 Å, and a thickness range of the drain is 3500 Å to 5000 Å.

In one of the embodiments, the source includes at least one of molybdenum, titanium, aluminum, and copper; the drain includes at least one of molybdenum, titanium, aluminum, and copper.

In one of the embodiments, a thickness range of the gate insulation layer is 3500 Å to 4000 Å.

In one of the embodiments, the gate insulation layer includes at least one of silicon oxide and silicon nitride.

In one of the embodiments, the thin film transistor structure further includes:

a protective layer, formed on the source and the drain.

In one of the embodiments, the protective layer includes at least one of silicon oxide and silicon nitride.

A display apparatus, including a thin film transistor structure, the thin film transistor structure includes:

a substrate;

a gate, formed on the substrate;

a gate insulation layer, formed on the substrate, the gate insulation layer covers the gate;

an active layer, formed on the gate insulation layer;

a doped layer, formed on the active layer; and a source and a drain, formed on the doped layer, a channel region is located in a middle portion of the doped layer, the channel region penetrates through the doped layer and partially penetrates to the active layer, the source and the drain are located on both sides of the channel region.

In the foregoing thin film transistor structure, the manufacturing method thereof, and the display apparatus, the channel region is heated for the first preset time, then placed in the atmosphere of nitrogen to heat for the second preset time, and at last placed in the atmosphere of ammonia to heat for the third preset time. Alternatively, the channel region is heated for the fourth preset time, and at last placed in the atmosphere of ammonia to heat for the fifth preset time, to recover damage to the channel region, reduce the number of weak bonds in the amorphous silicon, enhance irradiation of the thin film transistor and irradiation stability, and reduce drift of a threshold voltage, thereby improving a final display effect of the display apparatus.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF THE EMBODIMENTS

Figure 1:
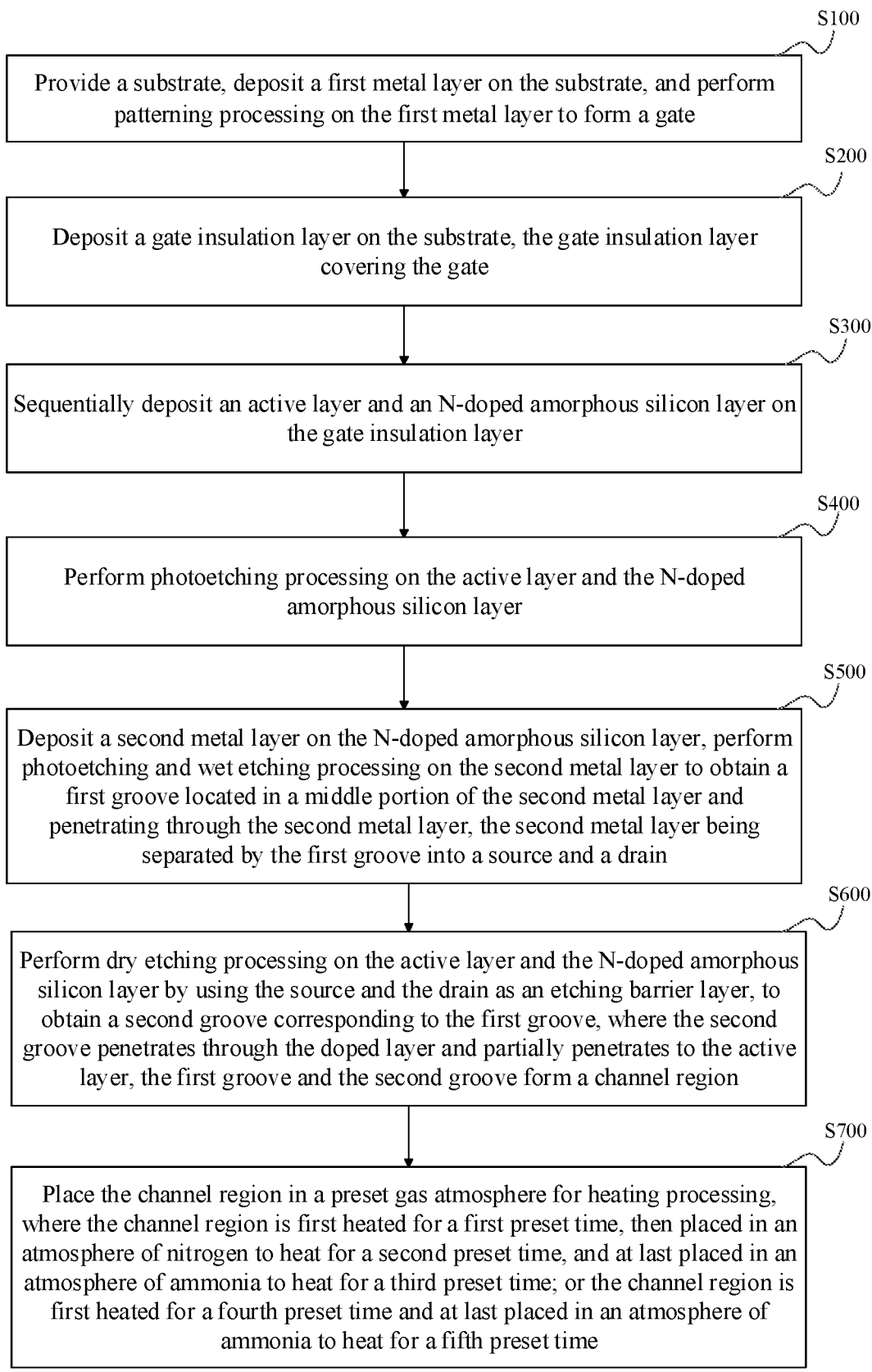
FIG. 1 is a flowchart of a method of manufacturing a thin film transistor structure according to an embodiment.

Embodiments of the disclosure are described more fully hereinafter with reference to the accompanying drawings. The various embodiments of the disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. Elements that are identified using the same or similar reference characters refer to the same or similar elements.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein, the term "and/or" includes any and all combinations of one or more of the associated listed items.

Referring to FIG. 1, FIG. 1 is a flowchart of a method of manufacturing a thin film transistor according to an embodiment. The method of manufacturing the thin film transistor may include steps of S100 to S700.

In step S100, a substrate is provided, and a first metal layer is deposited on the substrate, and patterning processing is performed on the first metal layer to form a gate.

Figure 2:
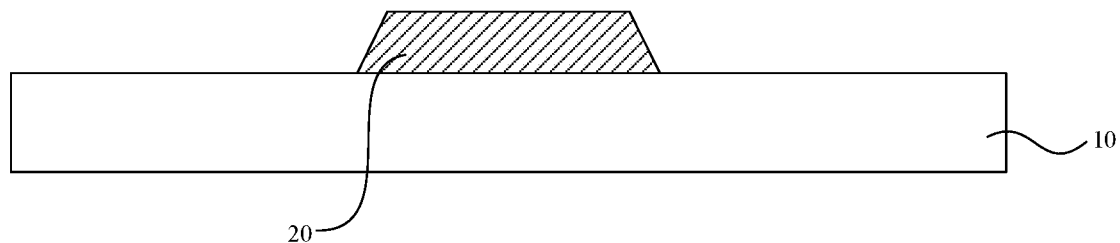
FIG. 2 is a schematic view showing a structure formed in step S100 in FIG. 1.

Specifically, referring to FIG. 2 as well, the substrate 10 may be a glass substrate or a plastic substrate. The glass substrate may be an alkali-free borosilicate ultra-thin glass. The alkali-free borosilicate glass has relatively good physical properties and anti-corrosion performance, relatively high thermal stability, a relatively low density, and a relatively high elasticity modulus. Depositing the first metal layer (not shown in FIG. 2) on the substrate 10 may be radio frequency magnetron sputtering, thermal evaporation, vacuum electron beam evaporation, and a plasma enhanced chemical vapor deposition process. The first metal layer (not shown in FIG. 2) may be one of or a stack combination of a plurality of molybdenum, titanium, aluminum, and copper. The patterning processing may be processing through photoetching to form a needed pattern, that is, the gate 20. A thickness range of the gate 20 may be 3000 Å to 5000 Å. Optionally, a thickness of the gate 20 may range from 3000 Å to 4000 Å. Further, the thickness of the gate 20 may range 4000 Å to 5000 Å. It may be understood that the thickness of the gate 20 may be selected and adjusted according to an actual application situation and product performance and is not further limited therein.

In step S200, a gate insulation layer is deposited on the substrate, and the gate insulation layer covers the gate.

Figure 3:
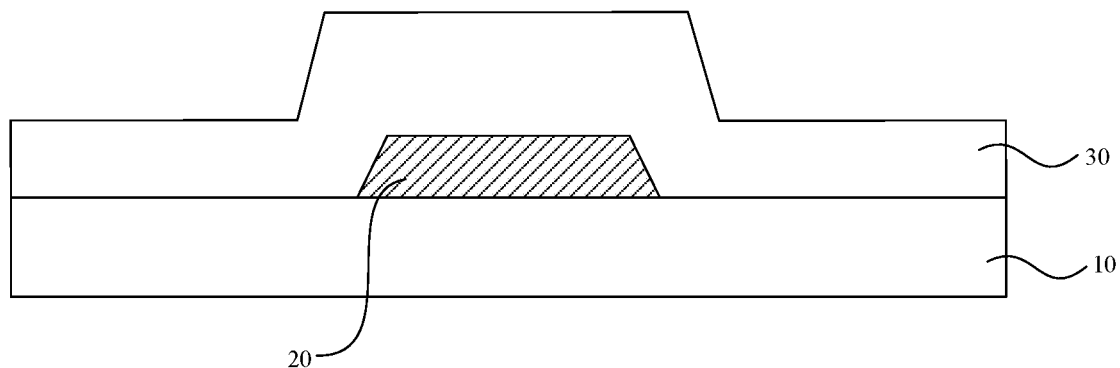
FIG. 3 is a schematic view showing a structure formed according to step S200 in FIG. 1.

Specifically, referring to FIG. 3 as well, the gate insulation layer 30 is deposited on the substrate 10, and the gate insulation layer 30 covers the gate 20. The deposition process may include radio frequency magnetron sputtering, thermal evaporation, vacuum electron beam evaporation, and a plasma enhanced chemical vapor deposition process. A thickness of the gate insulation layer 30 may range from 3500 Å to 4000 Å. Optionally, the thickness of gate insulation layer 30 may range from 3500 Å to 3700 Å. Further, the thickness of gate insulation layer 30 may range from 3700 Å to 4000 Å. It may be understood that the thickness of the gate insulation layer 30 may be selected and adjusted according to an actual application situation and product performance and is not further limited therein. A material of the gate insulation layer 30 may be one of or a combination of silicon oxide and silicon nitride. That is, the gate insulation layer 30 may be silicon oxide or silicon nitride or a mixture of silicon oxide and silicon nitride.

Optionally, using the plasma enhanced chemical vapor deposition process as an example, depositing the gate insulation layer 30 by using the plasma enhanced chemical vapor deposition may be divided into a first rate deposition, a second rate deposition, and a third rate deposition. Values of the first rate, the second rate, and the third rate sequentially decrease. In other words, the value of the first value is greater than that of the second rate, and the value of the second rate is greater than that of the third rate. This may be understood in this way: using an example in which the first rate is a high speed, the second rate is correspondingly an intermediate speed, and the third rate is correspondingly a low speed. Certainly, specific values are not specially limited in the present disclosure and may be adjusted and selected by a person skilled in the art according to an actual production situation and product performance. Further, a thickness of the gate insulation layer formed by the first rate deposition ranges from 500 Å to 1000 Å, a thickness of the gate insulation layer formed by the second rate deposition is 1000 Å, and a thickness of the gate insulation layer formed by the third rate deposition is 2000 Å. Deposition forming of the gate insulation layer 30 is divided into three deposition phases. The first rate deposition is first used to increase a deposition rate and improve a capacity; then the second rate deposition is used to transit rates and is transited to the third deposition rate for deposition, so that a channel region subsequently formed has good interface characteristics. In addition, concave-convex characteristics of amorphous silicon and a gate insulation layer interface may also be reduced, and electron mobility is improved.

In step S300, an active layer and a doped layer are sequentially deposited on the gate insulation layer.

Specifically, the active layer 40 and the doped layer 50 may be deposited through radio frequency magnetron sputtering, thermal evaporation, vacuum electron beam evaporation, and a plasma enhanced chemical vapor deposition process. For example, plasma enhanced chemical vapor deposition is used as an example. A $SiH_4$ gas may be used to deposit the active layer 40, and $PH_3$ and $SiH_4$ gases may be used to deposit the doped layer 50. In addition, a temperature at which the doped layer 50 is deposited may range from 300° C. to 400° C. Optionally, the temperature at which the doped layer 50 is deposited may range from 300° C. to 360° C., or the temperature at which the doped layer 50 is deposited may range from 340° C. to 360° C. Optionally, when the doped layer 50 is deposited, deposition is performed in a manner of increasing a total volume of a deposition gas, a reference range of the total volume is 41200 sccm to 43200 sccm, and sccm means standard cubic centimeters per minute. When the total volume increases by 100%, a gas flow ratio of $PH_3$ to $SiH_4$ in the deposition gas ranges from 1.8 to 4.5. That the total volume increases by 100% herein means increasing by 100% based on a reference range of the total volume of the deposition gas well known to a person skilled in the art. For example, the total volume may increase by 100% based on 41200 sccm. After the total volume increases 100%, the gas flow ratio of $PH_3$ to $SiH_4$ in the deposition gas may range from 1.8 to 4.5. Optionally, the gas flow ratio of $PH_3$ to $SiH_4$ may range from 1.8 to 3. Optionally, the gas flow ratio of $PH_3$ to $SiH_4$ may range from 3 to 4.5. It may be understood that the deposition gas may further include $H_2$, $NH_3$, $N_2$, and Ar. Flow ratios of these gases are not further limited and may be selected and adjusted according to product performance and an actual situation. Further, when the total volume increases by 150%, the gas flow ratio of $PH_3$ to $SiH_4$ in the deposition gas ranges from 2 to 6. That the total volume increases by 150% herein means increasing by 150% based on a reference range of the total volume of the deposition gas well known to a person skilled in the art. For example, the total volume may increase by 150% based on 43200 sccm. After the total volume increases 150%, the gas flow ratio of $PH_3$ to $SiH_4$ may range from 2 to 6. Optionally, the gas flow ratio of $PH_3$ to $SiH_4$ may range from 2 to 4. Optionally, the gas flow ratio of $PH_3$ to $SiH_4$ may range from 4 to 6. By increasing total volumes of $PH_3$ and $SiH_4$, the gas flow ratio of $PH_3$ to $SiH_4$ increases, to reduce a threshold voltage drift and obtain a good image sticking (IS) effect.

In step S400, photoetching processing is performed on the active layer and the doped layer.

Figure 4:
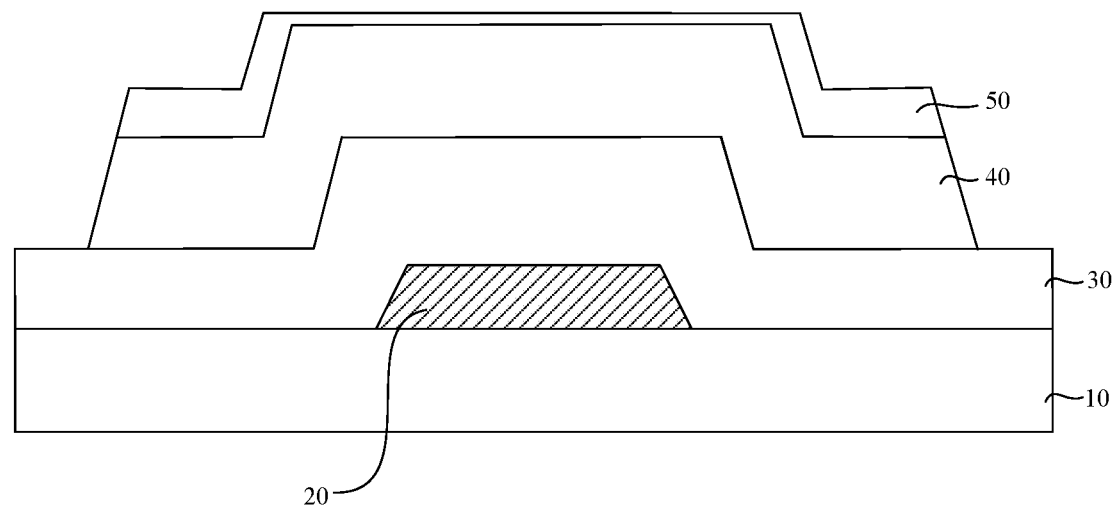
FIG. 4 is a schematic view showing a structure formed according to step S300 and step S400 in FIG. 1.

Specifically, referring to FIG. 4 as well, the photoetching processing is performed on the active layer 40 and the doped layer 50 to obtain a three-dimensional pattern shown in FIG. 4. Photoetching means using a mask with a design pattern and exposing and developing the mask, so that a photosensitive photoresist forms a three-dimensional empaistic pattern on a substrate.

In step S500, a second metal layer is deposited on the doped layer, photoetching and wet etching processing are performed on the second metal layer to obtain a first groove located in a middle portion of the second metal layer and penetrating through the second metal layer. The second metal layer is separated by the first groove into a source and a drain.

Figure 5:
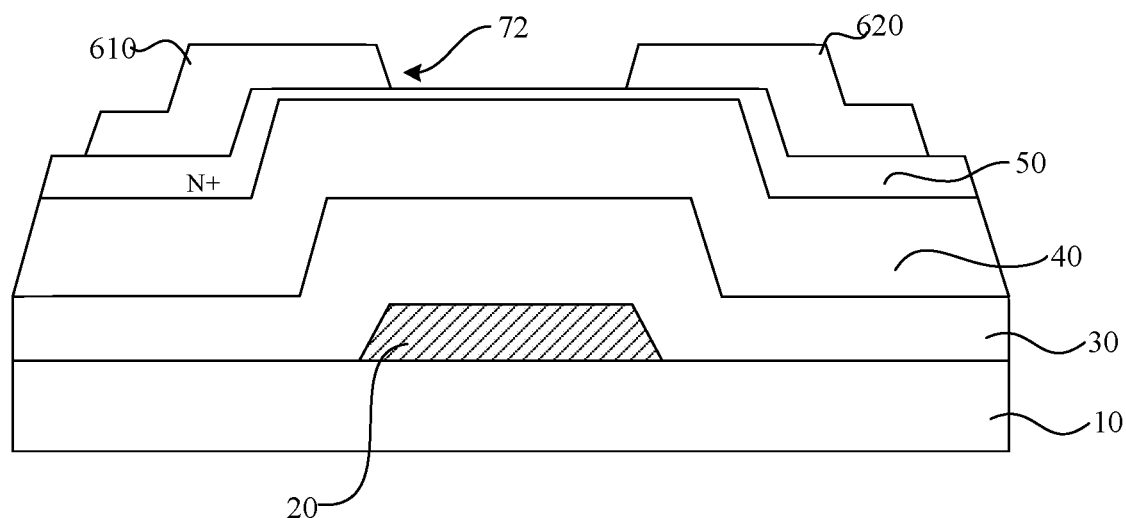
FIG. 5 is a schematic view showing a structure formed according to step S500 in FIG. 1.

Specifically, Referring to FIG. 5 as well, the second metal layer (not shown in FIG. 5) is deposited on the doped layer 50, photoetching and wet etching processing are performed on the second metal layer, to obtain the first groove 72 located in the middle portion of the second metal layer and penetrating through the second metal layer, and the second metal layer is separated by the first groove 72 into the source 610 and the drain 620. Further, a photoresist layer is coated on the second metal layer, and then a photomask is used to expose and develop the photoresist layer. Further, then the photoresist layer is used as a shield to perform wet etching on the second metal layer, to obtain the first groove 72 in the middle portion of the second metal layer and penetrating through the second metal layer, to obtain a three-dimensional pattern shown in FIG. 5. The source 610 and the drain 620 are respectively located on a left side and a right side of the first groove 72.

In step S600, dry etching processing is performed on the active layer and the doped layer by using the source and the drain as an etching barrier layer, to obtain a second groove corresponding to the first groove. The second groove penetrates through the doped layer and partially penetrates to the active layer, and the first groove and the second groove form a channel region.

Figure 6:
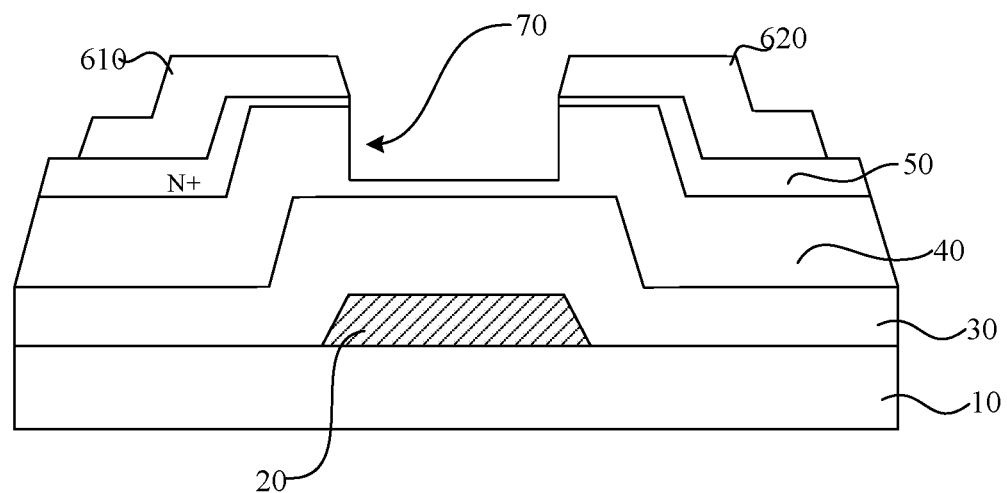
FIG. 6 is a schematic view showing a structure formed according to step S600 in FIG. 1.

Specifically, referring to FIG. 6 as well, after the source 610 and the drain 620 are formed, the source 610 and the drain 620 are used as the etching barrier layer, and the dry etching processing is performed on the active layer 40 and the doped layer 50, to obtain the second groove (not shown in FIG. 6) corresponding to the first groove 72. The second groove penetrates through the doped layer 50 and partially penetrates to the active layer 40. "Partially penetrating" means not etching the whole active layer located in the second groove. Because the active layer is used as a conductive medium, the active layer cannot be completely etched. It may be understood that a specific thickness of "partially" may be selected and adjusted according to an actual production situation and product performance. The first groove 72 and the second groove form the channel region 70.

In step S700, the channel region is placed in a preset gas atmosphere for heating processing. The channel region is placed in an atmosphere of nitrogen to heat for a first preset time, and heated in a mixed atmosphere of nitrogen and ammonia for a second preset time, and is heated in an atmosphere of ammonia for a third preset time. Alternatively, the channel region is first heated for a fourth preset time and at last placed in an atmosphere of ammonia to heat for a fifth preset time.

Specifically, when the active layer 40 and the doped layer 50 are etched to form the channel region 70, the channel region 70 is damaged. Therefore, to recover the damage to the channel region, gas heating processing may be performed on the channel region 70. A specific heating environment and heating time may be: the channel region is first heated for 0 s to 50 s at a heating temperature of 275° C. to 285° C. Optionally, the channel region is first heated for 25 s and then placed in an atmosphere of nitrogen for 0 s to 20 s. Optionally, the channel region may be placed in an atmosphere of nitrogen to heat for 15 s, and at last placed in an atmosphere of ammonia to heat for 0 s to 20 s. Optionally, the channel region is heated for 7 s in an atmosphere of ammonia, and at last placed in an atmosphere of ammonia to heat for 0 s to 20 s. Optionally, the channel region is heated for 7 s in an atmosphere of ammonia. Alternatively, the channel region is first heated for 0 s to 50 s at a heating temperature of 275° C. to 285° C. Optionally, the channel region is first heated for 25 s and at last placed in an atmosphere of ammonia to heat for 0 s to 20 s. Optionally, the channel region is heated for 10 s in an atmosphere of ammonia.

In the foregoing method of manufacturing the thin film transistor structure, the channel region is heated for the first preset time, then placed in the atmosphere of nitrogen to heat for the second preset time, and at last placed in the atmosphere of ammonia to heat for the third preset time. Alternatively, the channel region is heated for the fourth preset time, and at last placed in the atmosphere of ammonia to heat for the fifth preset time, to recover damage to the channel region, reduce the number of weak bonds in the amorphous silicon, enhance irradiation of the thin film transistor and irradiation stability, and reduce drift of a threshold voltage, thereby improving a final display effect of the display apparatus. Further, by increasing total volumes of $PH_3$ and $SiH_4$, the gas flow ratio of $PH_3$ to $SiH_4$ increases, to reduce a threshold voltage drift and obtain a good image sticking (IS) effect as well as improving a final display effect of the display apparatus.

Figure 7:
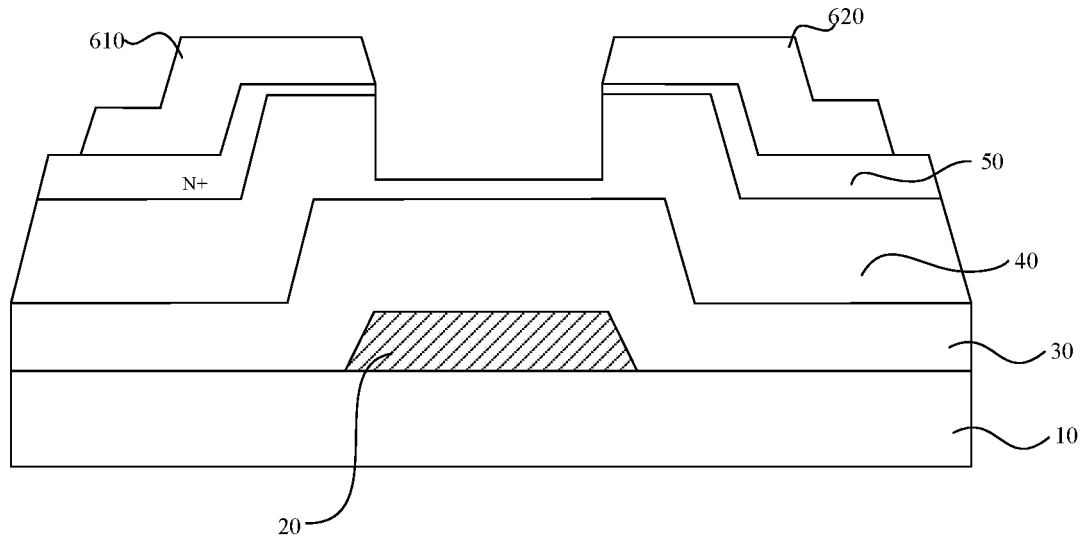
FIG. 7 is a schematic view of a thin film transistor structure according to an embodiment.

Referring to FIG. 7, FIG. 7 is a schematic view of a thin film transistor structure according to an embodiment. The thin film transistor structure is manufactured by using the foregoing embodiment of the method of manufacturing the thin film transistor structure. The thin film transistor structure may include a substrate 10, a gate 20, a gate insulation layer 30, an active layer 40, a doped layer 50, a source 610, and a drain 620. The gate 20 is formed on the substrate 10. The gate insulation layer 30 is formed on the substrate 10, and the gate insulation layer 30 covers the gate 20. The active layer 40 is formed on the gate insulation layer 30. The doped layer 50 is formed on the active layer 40. The source 610 and the drain 620 are formed on the doped layer 50. A channel region 70 is located in a middle portion of the doped layer 50, the channel region 70 penetrates through the doped layer 50 and partially penetrates to the active layer 40, and the source 610 and the drain 620 are located on both sides of the channel region 70.

The foregoing thin film transistor structure is manufactured through the foregoing embodiment of the method of manufacturing the thin film transistor structure. In the foregoing embodiment of the method of manufacturing the thin film transistor structure, the channel region is heated for the first preset time, then placed in an atmosphere of nitrogen to heat for the second preset time, and at least placed in an atmosphere of ammonia to heat for the third preset time. Alternatively, the channel region is heated for the fourth preset time, and at last placed in the atmosphere of ammonia to heat for the fifth preset time, to recover damage to the channel region, reduce the number of weak bonds in the amorphous silicon, enhance irradiation of the thin film transistor and irradiation stability, and reduce drift of a threshold voltage, so that the manufactured thin film transistor can improve a final display effect of the display apparatus. Further, by increasing total volumes of $PH_3$ and $SiH_4$, the gas flow ratio of $PH_3$ to $SiH_4$ increases, to reduce a threshold voltage drift and obtain a good image sticking (IS) effect so that the manufactured thin film transistor improves a final display effect of the display apparatus.

The substrate 10 may be a glass substrate or a plastic substrate. The glass substrate may be an alkali-free borosilicate ultra-thin glass. The alkali-free borosilicate glass has relatively good physical properties and anti-corrosion performance, relatively high thermal stability, a relatively low density, and a relatively high elasticity modulus.

The gate 20 is formed on the substrate 10. A forming process of the gate 20 may include radio frequency magnetron sputtering, thermal evaporation, vacuum electron beam evaporation, and a plasma enhanced chemical vapor deposition process. It may be understood that the forming process of the gate 20 may be selected and adjusted according to an actual application situation and product performance and is not further limited herein. A material of the gate 20 may be one of or a stack combination of a plurality of molybdenum, titanium, aluminum, and copper. It may ensure good conductive performance to select molybdenum, titanium, aluminum, and copper as the material of the gate 20. It may be understood that the material of the gate 20 may be selected and adjusted according to an actual application situation and product performance and is not further limited herein. A thickness range of the gate 20 may be 3000 Å to 5000 Å. Optionally, a thickness of the gate 20 may range from 3000 Å to 4000 Å. Further, the thickness of the gate 20 may range 4000 Å to 5000 Å. It may be understood that the thickness of the gate 20 may be selected and adjusted according to an actual application situation and product performance and is not further limited herein.

The gate insulation layer 30 is formed on the substrate 10. A forming process of the gate insulation layer 30 may include radio frequency magnetron sputtering, thermal evaporation, vacuum electron beam evaporation, and a plasma enhanced chemical vapor deposition process. It may be understood that the forming process of the gate insulation layer 30 may be selected and adjusted according to an actual application situation and product performance and is not further limited herein. A material of the gate insulation layer 30 may be one of or a combination of silicon oxide and silicon nitride. That is, the gate insulation layer 30 may be silicon oxide or silicon nitride or a mixture of silicon oxide and silicon nitride. It may be understood that the material of the gate insulation layer 30 may be selected and adjusted according to an actual application situation and product performance and is not further limited herein. A thickness of the gate insulation layer 30 may range from 3500 Å to 4000 Å. Optionally, the thickness of gate insulation layer 30 may range from 3500 Å to 3700 Å. Optionally, the thickness of gate insulation layer 30 may range from 3700 Å to 4000 Å. It may be understood that the thickness of the gate insulation layer 30 may be selected and adjusted according to an actual application situation and product performance and is not further limited herein.

The active layer 40 is formed on the gate insulation layer 30. A forming process of the active layer 40 may include radio frequency magnetron sputtering, thermal evaporation, vacuum electron beam evaporation, and a plasma enhanced chemical vapor deposition process. It may be understood that the forming process of the active layer 40 may be selected and adjusted according to an actual application situation and product performance and is not further limited herein. A material of the active layer 40 may be amorphous silicon, and the active layer 40 is usually used as a conductive medium. A thickness of the active layer 40 may range from 550 Å to 700 Å. Optionally, the thickness of the active layer 40 may range from 550 Å to 600 Å. Further, the thickness of the active layer 40 may range from 600 Å to 700 Å. It may be understood that the thickness of the active layer 40 may be selected and adjusted according to an actual application situation and product performance and is not further limited herein.

The doped layer 50 is formed on the active layer 40. A forming process of the doped layer 50 may include radio frequency magnetron sputtering, thermal evaporation, vacuum electron beam evaporation, and a plasma enhanced chemical vapor deposition process. It may be understood that the forming process of the doped layer 50 may be selected and adjusted according to an actual application situation and product performance and is not further limited herein. A thickness of the doped layer 50 may be 400 Å. It may be understood that the thickness of the doped layer 50 may be selected and adjusted according to an actual application situation and product performance and is not further limited herein. The doped layer 50 may be N-doped in an amorphous silicon layer or be P-doped in an amorphous silicon layer. Optionally, the doped layer 50 is N-doped in the amorphous silicon layer and is heavily N-doped. A doping manner may include high-temperature diffusion and ion injection. The high-temperature diffusion means diffusing or depositing impurity ions onto a surface of a silicon wafer through a gas phase source or doped oxide. These impurity concentrations monotonously decrease from the surface to inside. In the high-temperature diffusion, impurity distribution is mainly decided by a high temperature and a diffusion time. The ion injection means injecting doped ions into a semiconductor in a form of an ion beams. The impurity concentrations have distribution of peaks inside the semiconductor. Impurity distribution is mainly decided by ion masses and injected energy. N-doping is mainly doping a pentavalent impurity element, such as phosphorus and arsenic, inside the semiconductor. Advantages of the ion injection relative to the high-temperature diffusion are: 1. Injected ions are selected by a mass analyzer; selected particles have high purity and single energy, to prevent a doping concentration from being affected by purity of an impurity source. In addition, an injection process is conducted in a clean and dry vacuum condition; and various pollutions are reduced to lowest levels. 2. The number of doped atoms injected into a wafer can be accurately controlled; an injection dosage ranges from $10^{11}/cm^2$ for adjusting a threshold voltage to $10^{17}/cm^2$ for forming an insulating buried layer, and has a relatively broad range. 3. During ion injection, the substrate is usually kept under a room temperature or in a temperature environment lower than 400° C. Therefore, silicon dioxide, silicon nitride, aluminum, a photoresist, and the like can all be used to select a doped mask film, so that self-alignment technology in device manufacturing is more flexible.

The source 610 and the drain 620 are formed on the doped layer 50. Forming processes of the source 610 and the drain 620 may include radio frequency magnetron sputtering, thermal evaporation, vacuum electron beam evaporation, and a plasma enhanced chemical vapor deposition process. It may be understood that the forming processes of the source 610 and the drain 620 may be selected and adjusted according to an actual application situation and product performance and are not further limited herein. Materials of the source 610 and the drain 620 may be one of or a stack combination of a plurality of molybdenum, titanium, aluminum, and copper. It may ensure good conductive performance to select molybdenum, titanium, aluminum, and copper as the materials of the source 610 and the drain 620. It may be understood that the materials of the source 610 and the drain 620 may be selected and adjusted according to an actual application situation and product performance and are not further limited herein. Thicknesses of the source 610 and the drain 620 may range from 3500 Å to 5000 Å. Optionally, the thicknesses of the source 610 and the drain 620 may range from 3500 Å to 4000 Å. Further, the thicknesses of the source 610 and the drain 620 may range from 4000 Å to 5000 Å. It may be understood that the materials and thicknesses of the source 610 and the drain 620 may be the same or may be different. The materials and thicknesses of the source 610 and the drain 620 may be selected and adjusted according to an actual application situation and product performance and are not further limited herein.

The channel region 70 is located in the middle portion of the doped layer 50, and the channel region 70 penetrates through the doped layer 50 and partially penetrates through the active layer 40. The source 610 and the drain 620 are located on both sides of the channel region 70. "Penetrating" may be implemented through a photoetching or etching method, specifically, photoetching means using a mask with a design pattern and exposing and developing the mask, so that a photosensitive photoresist forms a three-dimensional empaistic pattern on a substrate. Etching means performing selective etching on a film layer by using different etching substances and methods according to different film layers on which micro-patterns need to be performed and under masking of a photoresist. In this way, after the photoresist is removed, a three-dimensional design pattern is transferred to a related film layer of the substrate.

Figure 8:
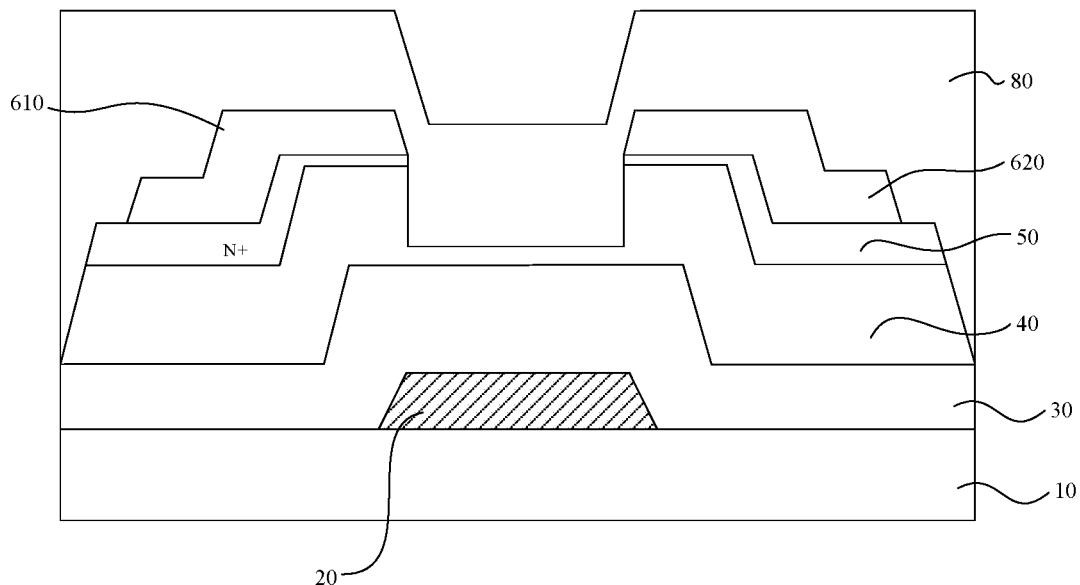
FIG. 8 is a schematic view of a thin film transistor structure according to another embodiment.

Referring to FIG. 8, FIG. 8 is a schematic view of a thin film transistor structure according to another embodiment. The thin film transistor structure may include a substrate 10, a gate 20, a gate insulation layer 30, an active layer 40, a doped layer 50, a source 610, a drain 620, and a protective layer 80. The gate 20 is formed on the substrate 10. The gate insulation layer 30 is formed on the substrate 10, and the gate insulation layer 30 covers the gate 20. The active layer 40 is formed on the gate insulation layer 30. The doped layer 50 is formed on the active layer 40. The source 610 and the drain 620 are formed on the doped layer 50. The protective layer 80 is formed on the source 610 and the drain 620. A channel region 70 is located in a middle portion of the doped layer 50, and the channel region 70 penetrates through the doped layer 50 and partially penetrates to the active layer 40. The source 610 and the drain 620 are located on both sides of the channel region 70, and the protective layer 80 covers the channel region 70.

It may be understood that for materials, forming processes, compositions, thicknesses, and the like of the substrate 10, the gate 20, the gate insulation layer 30, the active layer 40, the doped layer 50, the source 610, and the drain 620, refer to descriptions of the foregoing embodiment of the thin film transistor structure. Details are not further described herein.

The protective layer 80 is mainly used to prevent a thin film transistor device from being polluted and damaged. Specifically, the protective layer 80 is also referred to as a passivation (PV) layer. A material of the protective layer 80 may be silicon nitride, silicon oxide, or a combination of silicon nitride and silicon oxide. It may be understood that a thickness of the protective layer 80 is not specially limited and may be selected and adjusted by a person skilled in the art according to an actual production situation and product performance.

The foregoing thin film transistor structure is manufactured through the foregoing embodiment of the method of manufacturing the thin film transistor structure. In the foregoing embodiment of the method of manufacturing the thin film transistor structure, the channel region is heated for the first preset time, then placed in an atmosphere of nitrogen to heat for the second preset time, and at least placed in an atmosphere of ammonia to heat for the third preset time. Alternatively, the channel region is heated for the fourth preset time, and at last placed in the atmosphere of ammonia to heat for the fifth preset time, to recover damage to the channel region, reduce the number of weak bonds in the amorphous silicon, enhance irradiation of the thin film transistor and irradiation stability, and reduce drift of a threshold voltage, so that the manufactured thin film transistor can improve a final display effect of the display apparatus. Further, by increasing total volumes of $PH_3$ and $SiH_4$, the gas flow ratio of $PH_3$ to $SiH_4$ increases, to reduce a threshold voltage drift and obtain a good image sticking (IS) effect so that the manufactured thin film transistor improves a final display effect of the display apparatus. Further, the thin film transistor can be prevented from being damaged by setting the protective layer.

A display apparatus may include the foregoing embodiment of the thin film transistor structure. In the display apparatus, the thin film transistor structure is manufactured by using the foregoing embodiment of the method of manufacturing the thin film transistor structure. In the foregoing embodiment of the method of manufacturing the thin film transistor structure, the channel region is heated for the first preset time, then placed in the atmosphere of nitrogen to heat for the second preset time, and at last placed in the atmosphere of ammonia to heat for the third preset time. Alternatively, the channel region is heated for the fourth preset time, and at last placed in the atmosphere of ammonia to heat for the fifth preset time, to recover damage to the channel region, reduce the number of weak bonds in the amorphous silicon, enhance irradiation of the thin film transistor and irradiation stability, and reduce drift of a threshold voltage, so that the thin film transistor manufactured by using the foregoing manufacturing method can improve a final display effect of the display apparatus. Further, by increasing total volumes of $PH_3$ and $SiH_4$, the gas flow ratio of $PH_3$ to $SiH_4$ increases, to reduce a threshold voltage drift and obtain a good image sticking (IS) effect so that the thin film transistor manufactured by using the foregoing manufacturing method improves a final display effect of the display apparatus.

Technical features in the foregoing embodiments may be combined randomly. For the brevity of description, not all possible combinations of various technical features in the foregoing embodiments are described. However, as long as combinations of these technical features do not contradict each other, it should be considered that the combinations all fall within the scope of this specification.

The foregoing embodiments only show several implementations of the present disclosure and are described in detail, but they should not be construed as a limit to the patent scope of the present disclosure. It should be noted that, a person of ordinary skill in the art may make various changes and improvements without departing from the ideas of the present disclosure, which shall all fall within the protection scope of the present disclosure. Therefore, the protection scope of the patent of the present disclosure shall be subject to the appended claims.

What is claimed is:

1. A method of manufacturing a thin film transistor structure, comprising:

providing a substrate;

depositing a first metal layer on the substrate;

performing patterning processing on the first metal layer to form a gate;

depositing a gate insulation layer on the substrate, wherein the gate insulation layer covers the gate;

sequentially depositing an active layer and a doped layer on the gate insulation layer, wherein when depositing the doped layer, deposition is performed by increasing a total volume of a deposition gas, wherein a reference range of the total volume is about 41200 to 43200 sccm, and wherein when the total volume increases by 100%, a gas flow ratio of $PH_3$ to $SiH_4$ in the deposition gas ranges from 1.8 to 4.5;

performing photoetching processing on the active layer and the doped layer;

depositing a second metal layer on the doped layer;

performing photoetching and wet etching processing on the second metal layer to obtain a first groove located in a middle portion of the second metal layer and penetrating through the second metal layer, wherein the second metal layer is separated by the first groove into a source and a drain;

performing dry etching processing on the active layer and the doped layer using the source and the drain as an etching barrier layer to obtain a second groove corresponding to the first groove, wherein the second groove penetrates through the doped layer and partially penetrates the active layer, wherein the first and second grooves cooperatively form a channel region; and placing the channel region in a preset gas atmosphere for heating processing, wherein the channel region is placed in an atmosphere of nitrogen to heat for a first preset time, then placed in a mixed atmosphere of nitrogen and ammonia to heat for a second preset time, and then placed in an atmosphere of ammonia to heat for a third preset time; or the channel region is first heated for a fourth preset time and placed in an atmosphere of ammonia to heat for a fifth preset time.

2. The method according to claim 1, wherein when the total volume increases by 150%, the gas flow ratio of $PH_3$ to $SiH_4$ in the deposition gas ranges from 2 to 6.

3. The method according to claim 1, wherein the first preset time ranges from 0s to 50s, the second preset time ranges from 0s to 20s, the third preset time ranges from 0s to 20s, the fourth preset time ranges from 0s to 50s, and the fifth preset time ranges from 0s to 20s.

4. The method according to claim 3, wherein the first preset time is 25s, the second preset time is 15s, the third preset time is 7s, the fourth preset time is 25s, and the fifth preset time is 10s.

5. The method according to claim 1, wherein the step of depositing a gate insulation layer on the substrate layer is divided into a first rate deposition, a second rate deposition, and a third rate deposition, wherein the first rate, the second rate, and the third rate sequentially decrease.

6. The method according to claim 5, wherein a first thickness of the gate insulation layer formed by the first rate deposition ranges from 500 Å to 1000 Å, a second thickness of the gate insulation layer formed by the second rate deposition is 1000 Å, and a third thickness of the gate insulation layer formed by the third rate deposition is 2000 Å.

7. The method according to claim 1, wherein a deposition process of the first metal layer includes one of radio frequency magnetron sputtering, thermal evaporation, vacuum electron beam evaporation, and a plasma enhanced chemical vapor deposition process.

* * * * *